United States Patent
Tutunoglu et al.

(10) Patent No.: US 10,072,901 B2
(45) Date of Patent: Sep. 11, 2018

(54) INDIRECT EVAPORATOR COOLER HEAT EXCHANGER MANUFACTURING METHOD

(71) Applicant: SCHNEIDER ELECTRIC IT CORPORATION, West Kingston, RI (US)

(72) Inventors: Ozan Tutunoglu, O'Fallon, MO (US); John H. Bean, Jr., Wentzville, MO (US); Mohammed Adil, Bangalore (IN); Roy L. Grantham, O'Fallon, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 208 days.

(21) Appl. No.: 14/898,287

(22) PCT Filed: Jun. 28, 2013

(86) PCT No.: PCT/US2013/048506
§ 371 (c)(1),
(2) Date: Dec. 14, 2015

(87) PCT Pub. No.: WO2014/209345
PCT Pub. Date: Dec. 31, 2014

(65) Prior Publication Data
US 2016/0146552 A1 May 26, 2016

(51) Int. Cl.
*F28F 9/02* (2006.01)
*F28F 9/04* (2006.01)
(Continued)

(52) U.S. Cl.
CPC ............ *F28F 9/04* (2013.01); *B21D 53/08* (2013.01); *B23P 15/26* (2013.01);
(Continued)

(58) Field of Classification Search
CPC ...... F28F 9/04; F28F 1/022; F28F 1/40; F28F 9/16; F28F 21/062; F28F 21/067;
(Continued)

(56) References Cited

U.S. PATENT DOCUMENTS 3,648,768 A * 3/1972 Scholl ................... F28D 7/0041
165/158
3,991,457 A * 11/1976 Barton .................... B23P 15/26
29/890.038
(Continued)

FOREIGN PATENT DOCUMENTS

CN 101589286 A 11/2009
CN 102985779 A 3/2013
(Continued)

OTHER PUBLICATIONS

Notification of Transmittal of the International Search Report and the Written Opinion of the International Searching Authority from corresponding PCT/US2013/048506 dated Jan. 7, 2014.

*Primary Examiner* — Justin Jonaitis
(74) *Attorney, Agent, or Firm* — Lando & Anastasi, LLP

(57) ABSTRACT

A method for constructing a module of a modular cooling unit includes acquiring a plurality of tubes, each tube having a first end and a second end, and overmolding a first header onto the first ends of the plurality of tubes to form a watertight connection between the first header and the first ends of the plurality of tubes, the first header having a plurality of parallel first slots, each slot of the parallel first slots having an extended surface configured to receive and retain the first end of the tube.

20 Claims, 18 Drawing Sheets

(51) Int. Cl.
*B21D 53/08* (2006.01)
*F28F 1/40* (2006.01)
*F28F 21/06* (2006.01)
*F28F 1/02* (2006.01)
*F28F 9/16* (2006.01)
*F28D 1/053* (2006.01)
*H05K 7/20* (2006.01)
*B23P 15/26* (2006.01)
*F28D 21/00* (2006.01)

(52) U.S. Cl.
CPC .......... *F28D 1/05383* (2013.01); *F28F 1/022* (2013.01); *F28F 1/40* (2013.01); *F28F 9/16* (2013.01); *F28F 21/062* (2013.01); *F28F 21/067* (2013.01); *H05K 7/20809* (2013.01); *F28D 2021/0028* (2013.01); *F28F 2255/146* (2013.01); *F28F 2275/025* (2013.01)

(58) Field of Classification Search
CPC .......... F28F 2255/146; F28F 2275/025; B21D 53/08; B23P 15/26; F28D 1/05383; F28D 2021/0028; H05K 7/20809
USPC .......................................................... 165/173
See application file for complete search history.

(56) References Cited

U.S. PATENT DOCUMENTS

| | | | |
|---|---|---|---|
| 4,098,329 A | 7/1978 | Culver | |
| 4,326,582 A | 4/1982 | Rosman et al. | |
| 5,005,529 A | 4/1991 | Polcer | |
| 5,327,959 A * | 7/1994 | Saperstein | F28D 1/05391 165/153 |
| 5,835,976 A * | 11/1998 | Kent | G01M 3/228 73/40.7 |
| 7,112,297 B2 * | 9/2006 | Williams | B29C 45/14336 264/277 |
| 7,128,138 B2 | 10/2006 | Des Champs | |
| 7,419,251 B2 | 9/2008 | Leiser et al. | |
| 7,878,233 B2 | 2/2011 | Bates et al. | |
| 8,296,948 B2 * | 10/2012 | Lesage | B21D 53/085 165/153 |
| 2004/0226685 A1* | 11/2004 | Gagnon | F24F 12/006 165/54 |
| 2006/0091266 A1* | 5/2006 | Leiser | B29C 45/14614 248/68.1 |
| 2010/0025024 A1* | 2/2010 | Meshenky | F28D 7/1684 165/164 |
| 2011/0247792 A1 | 10/2011 | Chikuma et al. | |
| 2012/0103583 A1* | 5/2012 | Kim | F28D 1/05391 165/173 |
| 2013/0105127 A1 | 5/2013 | Postma et al. | |
| 2017/0016677 A1* | 1/2017 | Cheong | F28F 9/0224 |

FOREIGN PATENT DOCUMENTS

| | | |
|---|---|---|
| CN | 103090695 A | 5/2013 |
| EP | 1729373 B1 | 8/2012 |

* cited by examiner

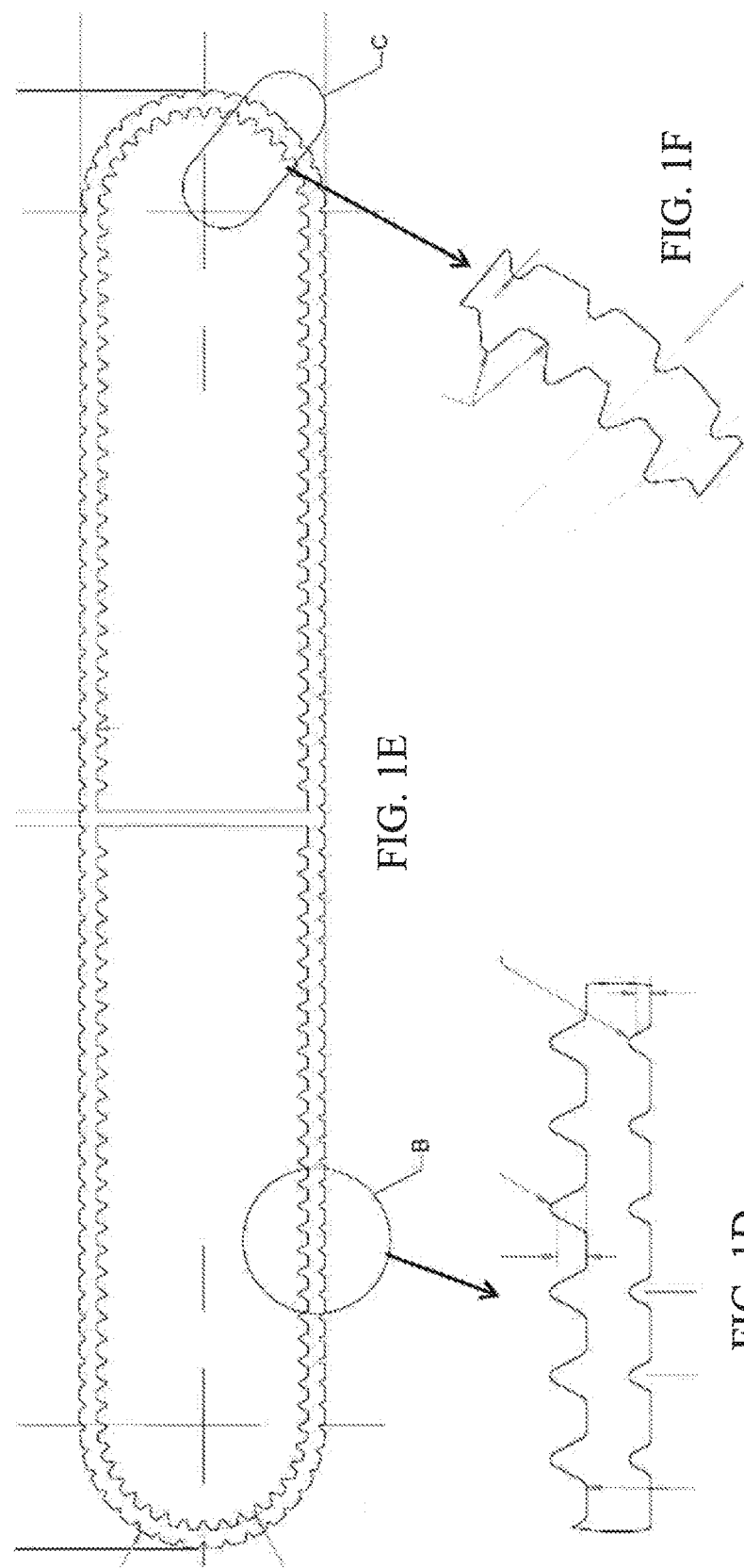

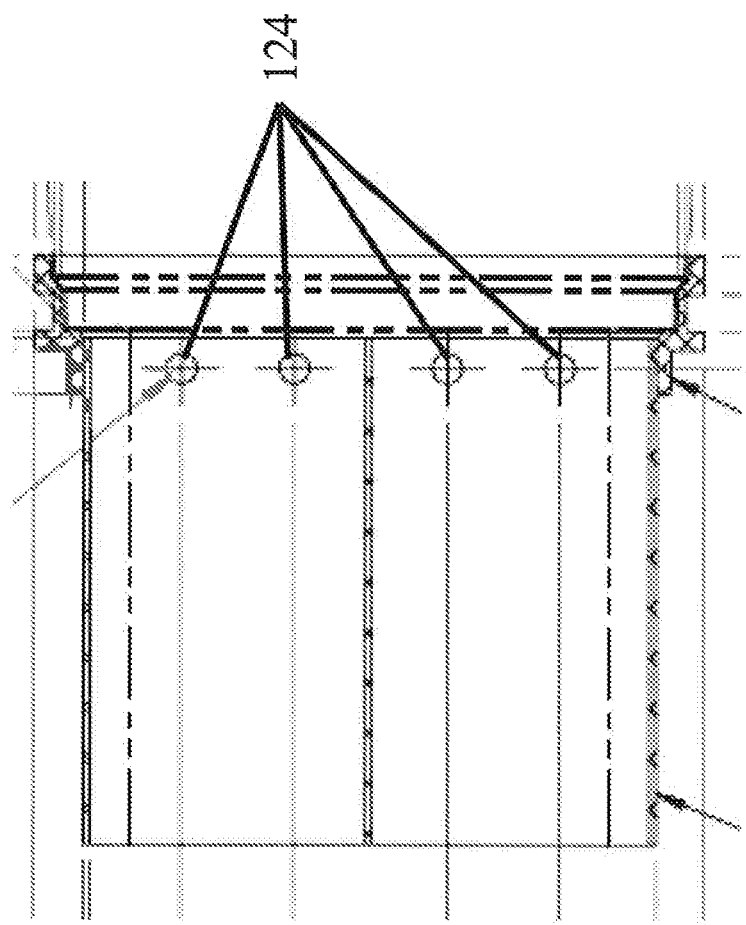

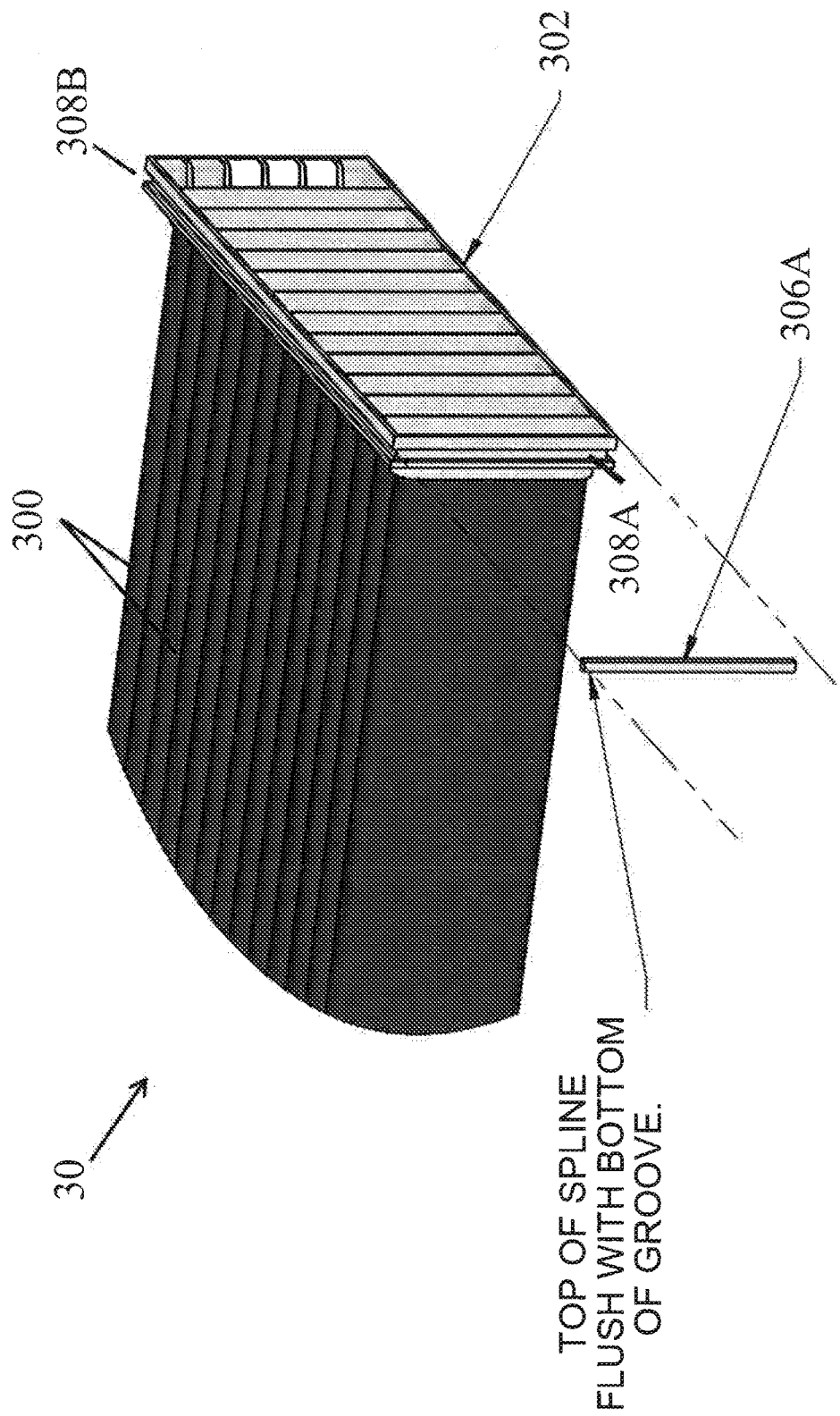

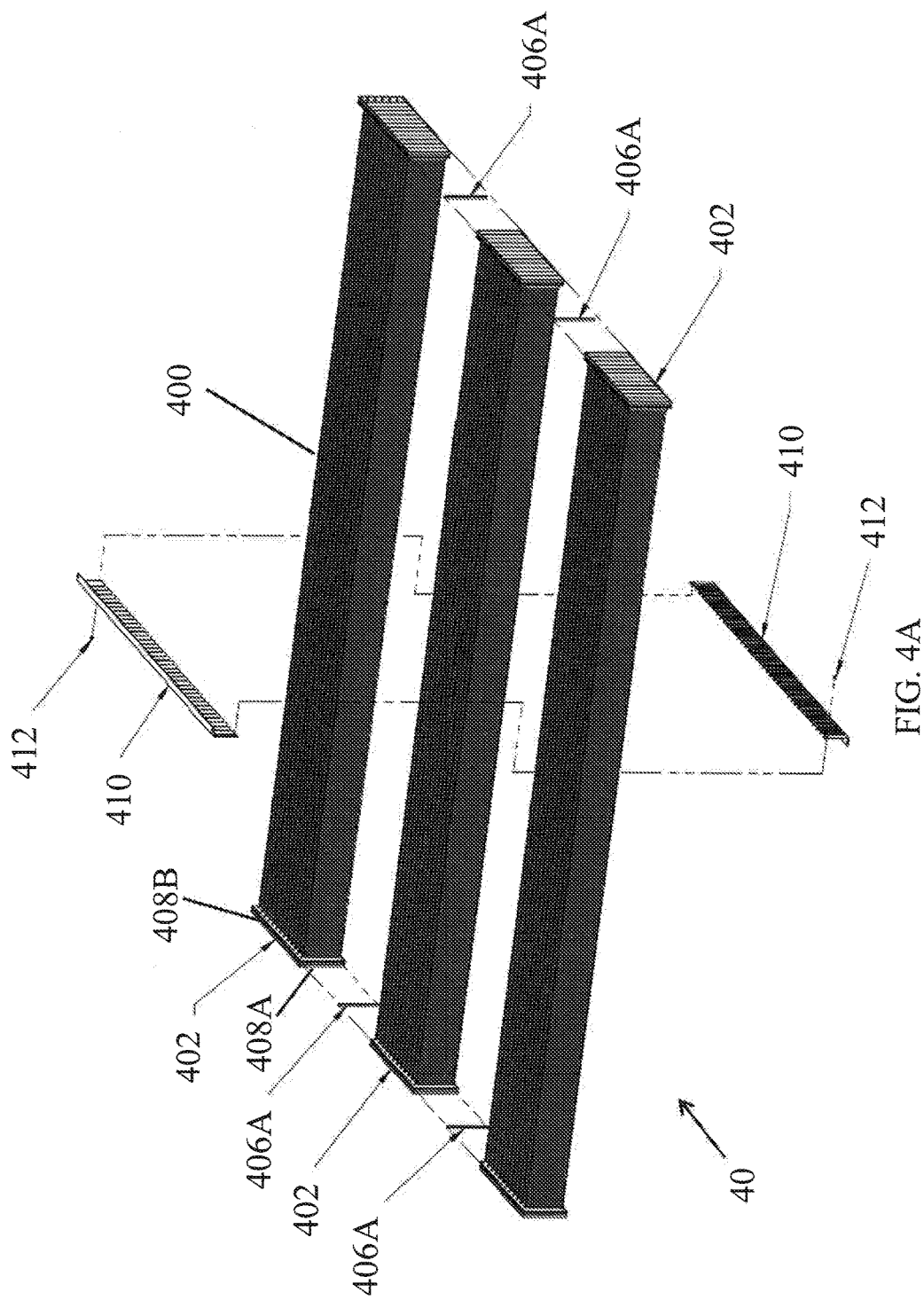

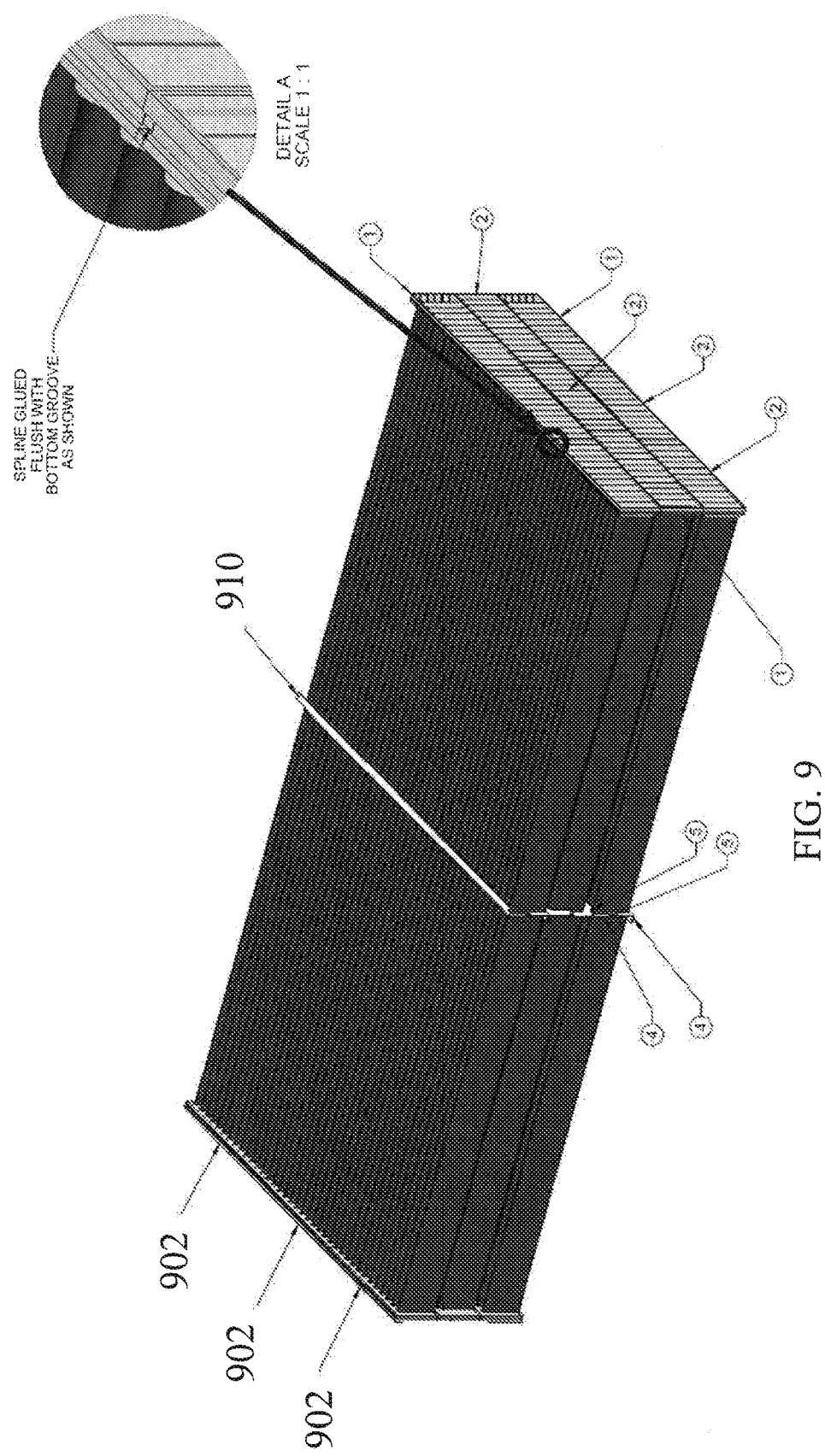

INDIRECT EVAPORATOR COOLER HEAT EXCHANGER MANUFACTURING METHOD

CROSS-REFERENCE TO RELATED APPLICATIONS

This application is a U.S. National Stage Application under 35 U.S.C. § 371 of International Application No. PCT/US2013/048506, filed Jun. 28, 2013, titled INDIRECT EVAPORATOR COOLER HEAT EXCHANGER MANUFACTURING METHOD, which is hereby incorporated herein by reference in its entirety.

FIELD OF DISCLOSURE

Aspects of the present disclosure relate generally to a method for manufacturing cooling systems used for cooling electronic equipment in data centers, and more particularly to methods used to manufacture cooling cores for indirect evaporator cooler (IEC) heat exchangers.

BACKGROUND OF DISCLOSURE

Indirect evaporative cooler (IEC) systems may provide at least one method for meeting the cooling requirements in a data center populated with one or more computer systems and associated electronic components. Existing IEC systems may utilize large assemblies that are constructed from a one-piece polymer cooling core that is housed within a stainless steel frame. The polymer core may include a plurality of tubes that function to exchange heat associated with air coming in from the data center. Existing IEC systems may suffer from a number of deficiencies. For example, the IEC system may be large and bulky and may therefore be difficult to install and service. In addition, the unit may be expensive to manufacture, operate, and maintain. Furthermore, if any part of the assembly fails air or water leak tests, then the entire assembly has to be removed and discarded.

SUMMARY OF DISCLOSURE

At least one aspect of the disclosure is directed to a method for constructing a module of a modular cooling unit. The method may include acquiring a plurality of tubes, where each tube has a first end and a second end. The method may further include overmolding a first header onto at least a portion of the first ends of the plurality of tubes, where the first header is configured to have a plurality of parallel first slots, and each slot of the parallel first slots is configured to have an extended surface that is configured to receive and retain the first end of the tube. Overmolding may allow the extended surfaces of the plurality of parallel first slots to form over the first ends of the plurality of tubes to create a watertight connection between the first header and the first ends of the plurality of tubes.

Embodiments of the method include overmolding a second header onto at least a portion of the second ends of the plurality of tubes, where the second header is configured to have a plurality of parallel second slots, and each slot of the parallel second slots is configured to have an extended surface configured to receive and retain the second end of the tube. Overmolding may allow the extended surfaces of the plurality of parallel second slots to form over the second ends of the plurality of tubes to create a watertight connection between the second header and the second ends of the plurality of tubes.

In at least one embodiment, the method may further include performing an air and leak test on the module. According to certain embodiments, the first header may further include a top groove, a bottom groove, a first side groove, and a second side groove. In various embodiments, the method may further include applying an adhesive in at least one of the top, bottom, first side, and second side grooves.

In some embodiments, the method may further include acquiring at least one spline and positioning a spline into at least one of the top, bottom, first side, and second side grooves containing the applied adhesive. The at least one spline may be dimensioned to be received and retained by and extend across at least a portion of the top, bottom, first side, and second side grooves.

According to one or more other aspects, the method may further include assembling one or more modules into a modular cooling unit. In at least one aspect, assembling one or more modules may include arranging at least two modules to be adjacent one another in a horizontal configuration, where the at least two modules are arranged such that a spline is positioned in the first side and the second side grooves between the at least two modules and a spline is positioned in the top grooves of the at least two horizontally adjacent modules. In some aspects, the method further includes positioning a spline in the bottom grooves of the at least two horizontally adjacent modules. In another aspect, assembling one or more modules includes arranging at least two modules to be adjacent one another in a vertical configuration, where the at least two modules are arranged such that a spline is positioned in the top and bottom grooves between the at least two vertically adjacent modules. In accordance with one or more embodiments, assembling one or more modules may include acquiring at least one gasket and positioning a gasket onto at least one of a top and a bottom of the one or more modules such that the gasket extends horizontally across at least a portion of the top and the bottom of the one or more modules. In some aspects, assembling one or more modules may include applying adhesive onto at least one of a top, a bottom, a first side, and a second side of the one or more modules.

Another aspect of the disclosure is directed to a module of a modular cooling unit. The module may include a plurality of tubes, where each tube has a first end and a second end, and a first header positioned at the first ends of the plurality of tubes to form a watertight connection between the first header and the first ends of the plurality of tubes. The first header may have a top groove, a bottom groove, a first side groove, and a second side groove, and a plurality of parallel first slots, where each slot of the parallel first slots has an extended surface configured to receive and retain the first end of the tube.

Embodiments of the module of the modular cooling unit may include a second header positioned at the second ends of the plurality of tubes to form a watertight connection between the second header and the second ends of the plurality of tubes. The second header may have a top groove, a bottom groove, a first side, and a second side groove, and a plurality of parallel second slots, where each of the parallel second slots has an extended surface configured to receive and retain the second end of the tube.

In certain aspects, the module may further include at least one spline, where the at least one spline is dimensioned to be received and retained by and extend across at least a portion of the top, bottom, first side, and second side grooves.

According to one or more aspects, at least two modules may be configured to be adjacent in a horizontal configuration, where the at least two modules are configured such that a spline is positioned in the first side and the second side grooves between the at least two horizontally adjacent modules and a spline is positioned in the top grooves of the at least two horizontally adjacent modules. In another aspect, a spline may be positioned in the bottom grooves of the at least two horizontally adjacent modules. In a further aspect, at least one module may have a different number of plurality of hollow tubes than another module, such that one or more horizontally arranged modules have a staggered configuration.

According to another aspect, at least two modules may be configured to be adjacent in a vertical configuration, where the at least two modules are configured such that a spline is positioned in the top and bottom grooves between the at least two vertically adjacent modules. In a further aspect, the at least one module may have a different number of plurality of hollow tubes than another module, such that one or more vertically arranged modules have a staggered configuration.

In accordance with one or more embodiments, a method of retrofitting a cooling unit is provided. The method may include replacing at least one component of the cooling unit with one or more modules. The module may include a plurality of tubes, where each tube has a first end and a second end. The module may include a first header positioned at the first ends of the plurality of tubes to form a watertight connection between the first header and the first ends of the plurality of tubes. The first header may have a top groove, a bottom groove, a first side groove, and a second side groove, and a plurality of parallel first slots, where each slot of the parallel first slots has an extended surface configured to receive and retain the first end of the tube.

BRIEF DESCRIPTION OF THE DRAWINGS

The accompanying drawings are not intended to be drawn to scale. In the drawings, when possible, each identical or nearly identical component that is illustrated in various figures is represented by a like numeral. For purposes of clarity, not every component may be labeled in every drawing. In the drawings:

FIGS. 1D-1F are a front elevational view of a tube and two close-up views of the tube wall in accordance with aspects of the invention;

FIG. 1G is a side elevational view of a tube in accordance with aspects of the invention;

FIG. 3 is a partial exploded perspective view of an exemplary module;

FIG. 4A is an exploded perspective view of three exemplary modules arranged in a horizontal configuration to form a 1×3 row arrangement;

FIG. 9 is a perspective view of the assembled configuration shown in FIG. 8;

DETAILED DESCRIPTION OF THE DISCLOSURE

Figures 1A, 1B:
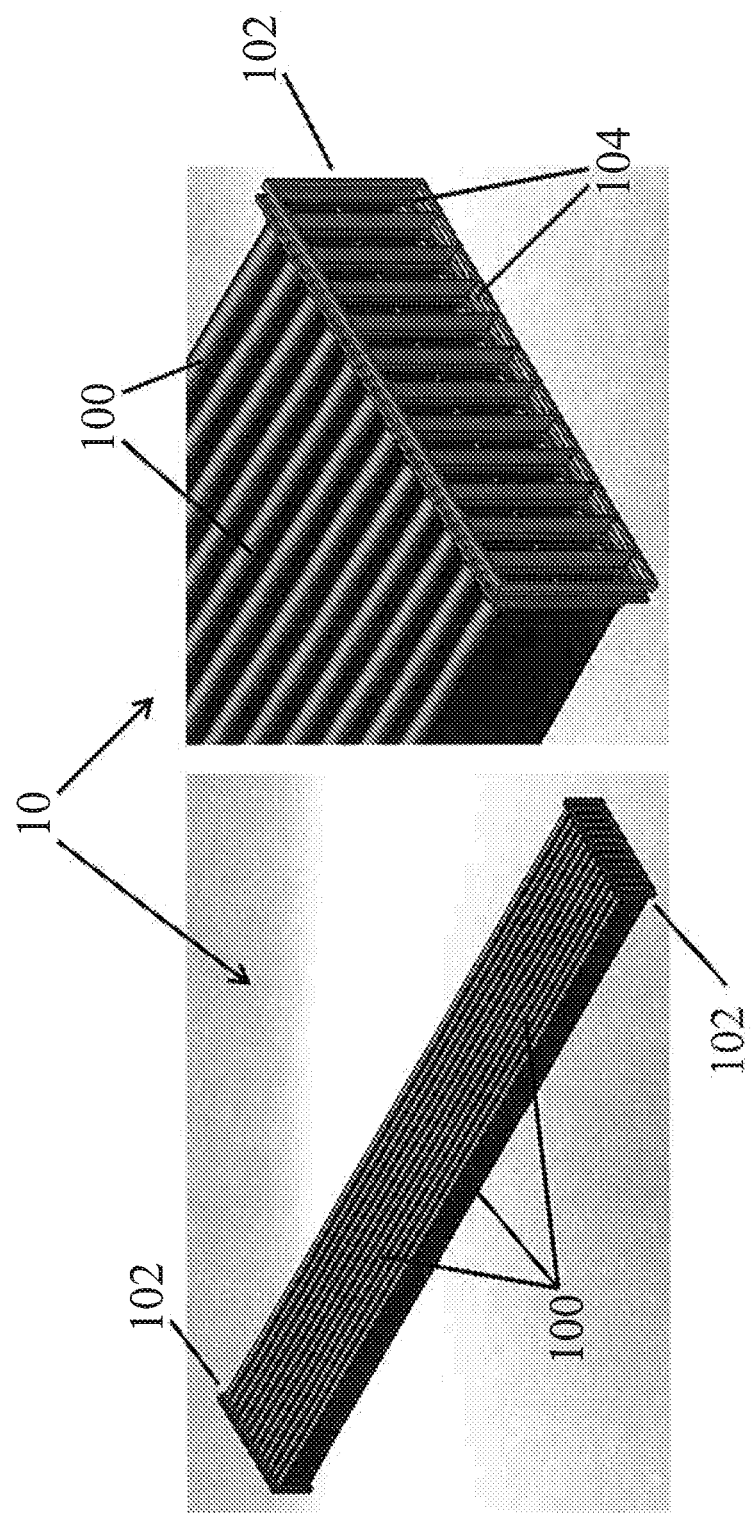
FIGS. 1A and 1B are perspective and close-up views, respectively, of a module in accordance with aspects of the invention.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The embodiments described herein provide a modular approach to the IEC design and manufacturing process. The modular approach offers a number of advantages, including the ability to construct the core of the IEC unit from smaller and lighter components. Other advantages include the capacity to perform air and leak tests on individual modular components of the IEC core before and after final assembly. In addition, if one of the modular components malfunctions during use, it can be removed and replaced without having to discard the entire cooling core assembly. Further advantages include lower manufacturing, operating, and maintenance costs, and increased ease associated with installation and removal of the entire assembly.

Turning now to the drawings, in order to address problems associated with currently existing IEC heat exchangers, a module, generally indicated at 10, is provided for use in a modular IEC cooling unit. As shown in FIG. 1, the module 10 may be may be constructed from one or more individual tubes 100 that are combined into a larger assembly. In one or more embodiments, the tubes may be elongate in length and generally elliptical in cross section, with a hollow interior, but other lengths and shapes are within the scope of this disclosure. For example, the tubes may have a cross section that is an elongated diamond in shape.

In one or more embodiments, each tube 100 may have a length in a range of from about 250 mm to about 10,000 mm. In some embodiments, each tube may have a length in a range of from about 1000 mm to about 5000 mm. According to yet another embodiment, each tube may have a length of from about 1500 mm to about 2000 mm. The internal height, and/or long axis of the interior of the tube may range from about 20 mm to about 1000 mm and the internal width, and/or short axis of the interior of the tube may range from about 5 mm to about 25 mm. According to some embodiments, the internal height of the tube may range from about 70 mm to about 80 mm and the internal width may range from about 2 mm to about 10 mm. In various embodiments, the tubes may have a wall thickness in a range of from about 0.5 mm to about 5 mm. In some embodiments, the wall thickness may be about 1 mm. The thickness of the tube wall may be dependent upon the type of material used for constructing the tube and the type of operating environment that the cooling unit may encounter. For example, if the tube is constructed from a glass-infused polymer, then the thickness of the tube may be thinner than a tube constructed from a polymer that is not infused with glass.

Figure 1C:
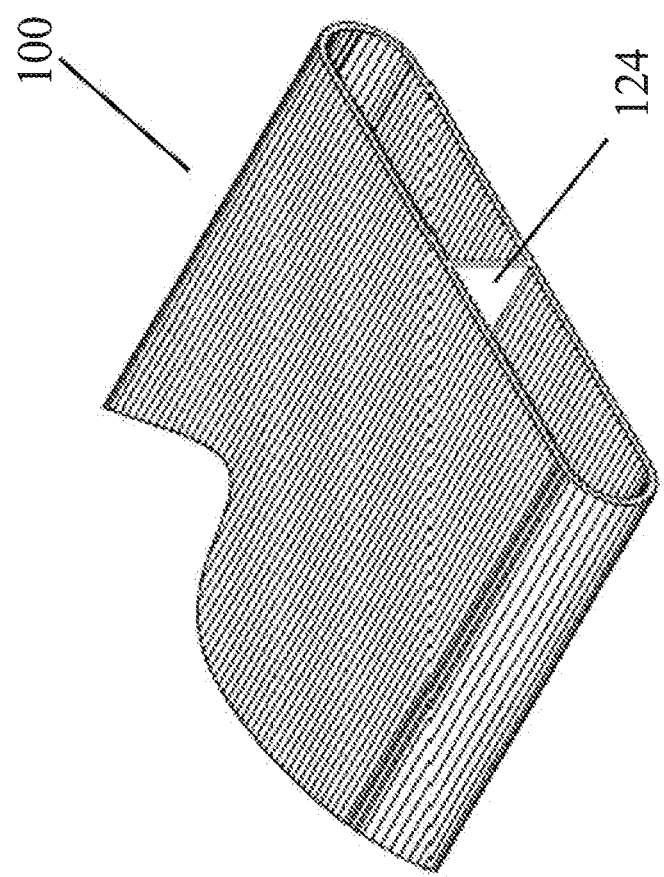
FIG. 1C is a perspective view of the end portion of a tube in accordance with aspects of the invention.

The inside of the tube 100 may further include one or more structures 124, such as the structure shown in FIG. 1C. For example, the tube 100 may include a support member positioned in the interior of the tube to prevent the tube from collapsing under stress. In another example, the tube may include one or more internal baffles that aid in providing additional internal surface area. According to some embodiments, the tube may include one or more dividing walls, so as to allow for multiple fluid flow paths. For example, the interior of the tubes may be partitioned, to allow for air flow in one or more different directions. The exterior of the tubes may include one or more structures to aid in providing additional surface area. For example, the exterior of the tubes may include rib structures and the rib structures may be exaggerated or elongated in shape. In other examples, the walls of the tube may be corrugated, as shown in FIGS. 1D-1F. The additional surface area provided by these features may increase the cooling capability and/or efficiency of the unit.

According to certain embodiments, the module 10 may include one or more tubes, depending on a desired cooling capacity and/or operating environment. For example, FIG. 1 illustrates a module 10 that includes 12 tubes. Other embodiments have modules with 11 or 13 tubes. The module 10 may have anywhere from 1 tube to 10,000 tubes. As shown in FIG. 1, in certain embodiments the tubes are arranged in a parallel flow arrangement, although other flow arrangements are within the scope of this disclosure. For example, a module may include multiple parallel tubes arranged into a vertical and horizontal configuration. This type of configuration may include 25 tubes arranged in a 5×5 configuration, or 1000 tubes arranged in a 10×10 configuration. Further, the number of tubes arranged vertically (i.e., in a column) may be different than the number of tubes arranged horizontally (i.e., in a row).

In at least one embodiment, the module further includes at least one header 102. A close-up view of an exemplary header 102 is shown in FIG. 1B. The header 102 may include one or more parallel slots 104 that correspond with each of the individual tubes 100. Each of the parallel slots 104 may include an extended surface that is configured to receive and retain one end of the tube 100. For example, the extended surface may have an elliptical shape that is dimensioned to engage with and surround the peripheral edge of the tube 100. The extended surface may also be dimensioned to overlap the end of the tube by a certain amount. For example, the header may overlap the ends of the tube by about 2 mm to about 50 mm. In some embodiments, the header may overlap the ends of the tube by about 3 mm to about 25 mm. In one or more embodiments, the header may overlap the ends of the tube by about 7 mm. The overlap over the end of the tube may be determined in part by the environmental conditions that the cooling unit will experience during use. For example, the overlap may be larger for colder environments to accommodate for tube shrinkage. The extended surface of the header may also include one or more structures that enhance the quality of the connection between the header and tubes. For example, the extended surface may include grooves or other features. Referring again to FIG. 1, when viewed from the front, the general shape of the header may be rectangular in shape, although other shapes, such as circular or square, are within the scope of this disclosure. Referring to FIG. 1G, the tube may contain one or more holes 124 in the sidewall that may be filled in during an overmolding process, as discussed further below. For example, the holes 124 may be filled in with polymer material that is also used to form the header, thus providing additional retention between the tube and header.

The header 102 may be attached, for example, by overmolding one or two headers onto opposite ends of the assembled tubes 100. In certain instances, overmolding may be performed by using an injection molding process, although other molding processes are within the scope of this disclosure. In one or more embodiments, the tubes 100 may be inserted into a header injection mold (not shown), where the header is overmolded onto the ends of the tubes. The header injection mold may be constructed so that a certain portion of the ends of tubes is exposed for overmolding. In the alternative, the one or more tubes may be overmolded without the assistance of an injection mold. According to one or more embodiments, multiple rows and/or columns of tubes may be overmolded at the same time. For example, two rows of 36 tubes each may be overmolded at one time, or three rows with 133 tubes arranged in a staggered formation, as discussed further below, may be overmolded at one time. The overmolded header may be formed by a material, such as a polymer, that may be injected into the mold over one or more exterior ends of the assembled tubes. The material may fill the mold cavity void and surround the ends of the tubes. Once the material is in the mold, it may cool to a shape that reflects the form of the header. As used herein, the term "overmolding" refers to molding a first part onto a second part such that the first part engages and surrounds at least one peripheral edge of the second part. Overmolding may provide a watertight connection between the header 102 and the tubes 100.

In some embodiments, the header 102 may be acquired or constructed separately and may then be attached onto the ends of the tubes 100, for example, by friction fitting. In other embodiments, adhesive may also be used to attach the header 102 to the ends of the tubes 100. In some embodiments, the ends of the tubes may include a rubber material that is then inserted into the extended surface of the header. In certain other embodiments, the header may be welded onto the ends of the tubes, for example, by using ultrasonic or plastic welding techniques. The header may be attached to the ends of the assembled tubes in any manner so long as a watertight connection is achieved between the extended surface of the header and the ends of the tubes.

In various embodiments, the tubes 100 and the header 102 may each be constructed from polymer materials. Suitable polymers include, for example, polyethylene (PE), polyphenylene ether (PPE), polypropylene (PP), and any mixture thereof. According to certain embodiments, the polymer may be of any type or combination of types that is capable of properly functioning with injection molding techniques. In certain embodiments, the polymer may further include one or more additives, for example, to aid in the transfer of heat, or to increase strength and/or durability. For example, glass may be added to one or more polymers that are used to construct the tubes and/or headers. In one or more embodiments, the polymer material may be fire-rated to resist combustion or degradation at high temperatures. For example, the polymer material may be V0 fire rated. In at least one embodiment, the tubes 100 and header 102 are constructed from the same material. Constructing the tubes and header from the same material may preserve the integrity of the watertight seal that is formed between these two elements. This may be especially important in situations where the module is subjected to rapid and/or frequent thermal cycling, since this type of environment may be detrimental to materials that do not expand and contract at the same rate and/or by the same amount. In some embodiments, the tubes 100 and header 102 may be constructed from a metal material, such as aluminum or copper, or a metal alloy. In further embodiments, a metal alloy may be used. The material used for constructing the tubes 100 and headers 102 may be any material that is suitable for the purposes of performing a cooling function as described herein and is capable of performing in environments with temperatures that range from about from about $-250°$ C. to about $300°$ C.

In accordance with one or more embodiments, air and water leak testing may be performed on the module. For example, once the header has been overmolded onto one or both ends of the tubes, an air and water leak test may be implemented to ensure that the module is watertight, especially in the area where the header 102 is overmolded onto the tubes 100.

Figure 2:
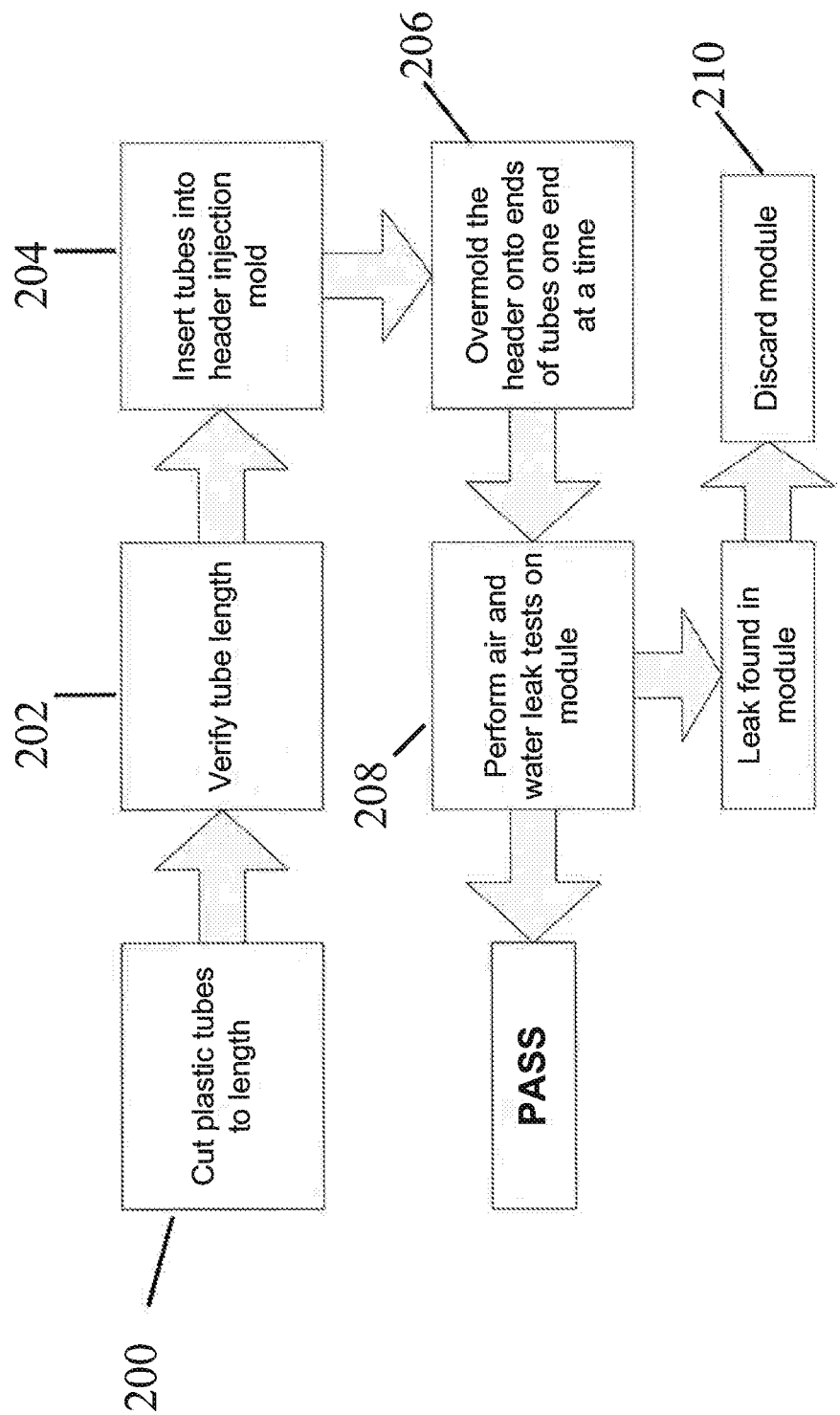
FIG. 2 is a flow chart showing an exemplary method for manufacturing a module.

An exemplary method for constructing a module is outlined in the flow chart of FIG. 2. As illustrated, the process may begin with step 200, where tubes constructed from a polymer material are cut to a desired length. The length of the tubes may be checked and verified in step 202. Next, the tubes may be inserted into a mold assembly in step 204, where they are overmolded, for example, by an injection molding process performed in step 206, to form the headers. The tubes may be overmolded on one end or on both ends. Once the module is removed from the mold assembly, it can be air and water leak tested in step 208. If the module passes the air and water leak test, it may move on for further processing (discussed below). If it fails, the module may be discarded, as exemplified in step 210, or in the alternative, the module may be repaired and tested again.

Referring to FIG. 3, a partial exploded view of a header 302 overmolded onto 13 tubes 300 of a module, generally indicated at 30, is shown. The header 302 may further include one or more three-sided recesses or grooves 308A and 308B that are oriented in the vertical direction 308A, or horizontal direction 308B. The grooves may be located on the top, bottom, and sides of the header 302. The grooves 308A and 308B may be configured to accommodate support rods or vertical splines 306A. For example, the grooves may have a circular, square, or as shown in FIG. 3, a rectangular shaped recess with a square cross section. In one or more embodiments, the grooves may have a symmetrical cross section. For example, the grooves may have a 4 mm square cross section. In other embodiments, the grooves may have a cross sectional area that is not symmetrical, i.e., the depth dimension is larger than the width or height.

The module 30 may further include vertical splines 306A. The vertical splines 306A may be dimensioned to be received and retained by the vertical grooves 308A, and therefore may have a circular, square, or, as shown in FIG. 3, rectangular shape with a rectangular cross section. As used herein, the term "spline" refers to a structure that is adapted for insertion into a receiving recess of the groove provided by the header. For example, FIG. 3 illustrates a vertical spline 306A that is oriented vertically and is dimensioned to fit into the vertical groove 308A positioned on a side of the header 302. Likewise, another spline 306B (not shown) oriented in the horizontal direction, may be dimensioned to fit into the horizontal groove 308B that is positioned on the top of the header 302. The splines may be constructed from any one of a number of different materials, including the same materials used to construct the tubes 300 and header 302, such as one or more polymers, or metals, or metal alloys. In certain embodiments, the spline may be constructed from a wood material. In some embodiments, the spline may have a length that is the same length of the corresponding groove. In other embodiments, the spline may have a length that is slightly shorter than the length of the corresponding groove. For example, in FIG. 3, the vertical spline 306A has a length such that when it is inserted into the vertical groove 308A, each respective end is flush or even with the bottom of the respective top and bottom groove 308A. In other embodiments, the spline may have a length that extends across multiple grooves in adjacent headers. For example, if three modules are placed in a horizontal and a parallel configuration, a horizontal spline may extend across all three of the top grooves in the headers of the three modules. The splines may be dimensioned to have a width such that when inserted into the corresponding groove, the spline extends past the upper surface of the groove by a certain amount. In various embodiments, the spline may have a symmetrical cross section, such as 4 mm square. As discussed further below, the extended surface of the spline may be received and retained by a corresponding groove in the header 302 of an adjacent module. The splines 306 may function to provide structural support to one or more modules when they are assembled together, as discussed further below.

Turning to FIG. 4A, one or more modules may be combined into a larger assembly, generally indicated at 40. For example, three modules may be positioned adjacent one another in a horizontal configuration, such that the tubes 400 of each respective module are parallel to the tubes 400 of an adjacent module. When assembled, a vertical spline 406A may be positioned into adjacent side grooves 408A such that the vertical spline 406A serves to join or bond the two modules together. In one or more embodiments, an adhesive material may be used in the grooves 408A and 408B to aid in joining the modules to one another. Suitable adhesives include epoxy materials, double-sided tape, UV-curable materials, and thermoplastic adhesives. For example, in one or more embodiments, a LOXEAL™ 59-40 ((MI) Italy) type of adhesive may be used. The adhesive may be any type of adhesive that is suitable for the purpose of performing as an adhesive under the operating conditions of the cooling unit, and is compatible with the materials used for the splines and headers. In other embodiments, the splines may be welded, such as by using ultrasonic or plastic welding techniques, into a groove of the header. In the alternative, the modules may be attached to one another, without the use of a spline, by using one or more attachment techniques, such as an adhesive. For example, in some embodiments, the grooves of one header may be configured to mate with the grooves of an adjacent header. Additional adhesive or other attachment techniques may be used to aid in attaching the two modules together. In various embodiments, one or more modules may be positioned adjacent one another in a vertical configuration, such that the tubes of each respective module are parallel to the tubes of a vertically adjacent module. In this embodiment, the spline may be positioned into adjacent top or bottom grooves to join the two modules together.

Figure 4B:
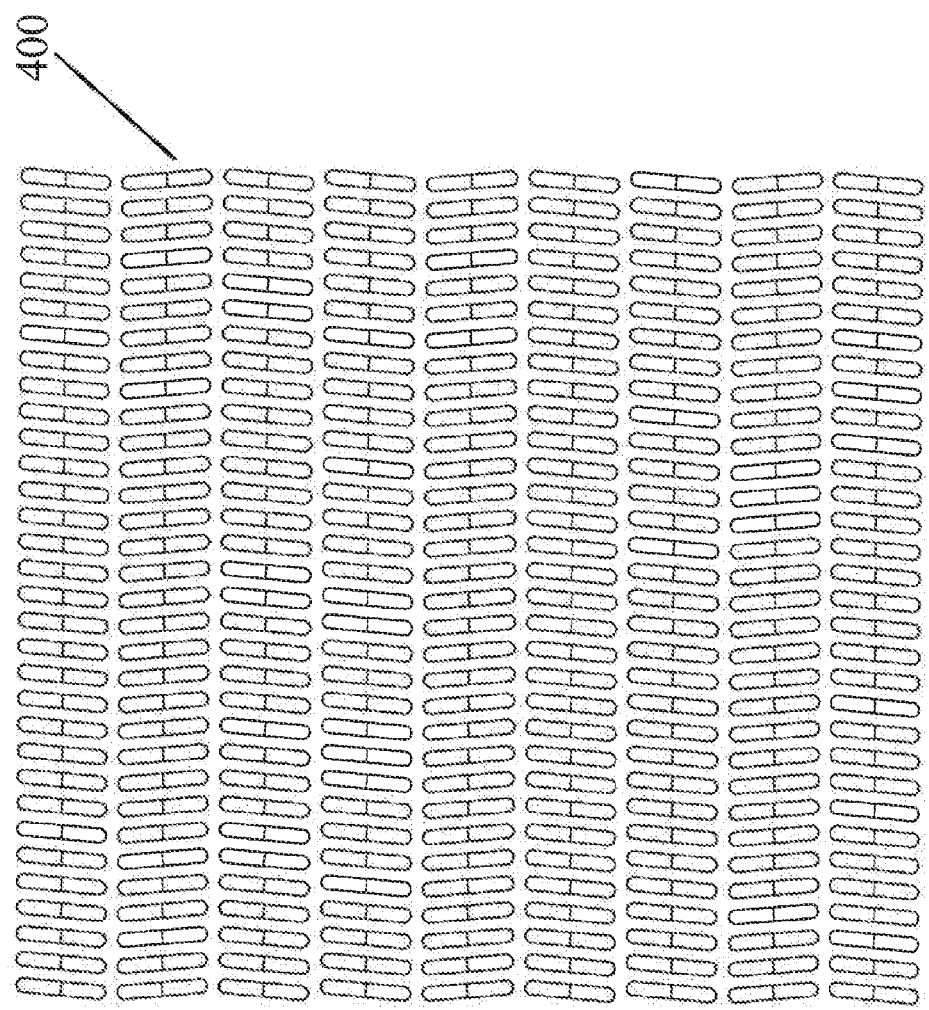
FIG. 4B is a front elevational view of tubes oriented at an angle in accordance with aspects of the invention.

In one or more embodiments, the tubes may be oriented vertically, or at an angle, such as the tubes 400 represented in FIG. 4B. The long axis, or in the alternative, the short axis, of one or more tubes 400 may be oriented at any angle from 0° to +/−180°. For example, in FIG. 4B, one row of a tube assembly may have tubes oriented at a +5° angle and another row of the tube assembly may have tubes oriented at a −5° angle. As appreciated by one or ordinary skill in the art, the rows or columns of a tube assembly may have one or more tubes oriented at different angles.

As illustrated in FIG. 4A, one or more support brackets 410 may be positioned at any point along the linear section of parallel tubes 400. The support bracket 410 may be constructed from two mating pieces, such as the top and bottom brackets illustrated in the figure. The brackets may be attached to each other and/or to external framework, rails, or panels using one or more mechanical fasteners 412. In one or more embodiments, the fasteners 412 may be rivets or screws. Other non-limiting examples of fasteners include staples, pins, or bolts. The brackets 410 and fasteners 412 may be used to transfer load vertically and to decrease vibration during operation. The number of brackets 410 and fasteners 412 may be dependent on the length of the tubes 400. For example, tubes that are about nine meters in length may include five sets of brackets that are evenly distributed along the length of the tubes. Shorter tubes may require fewer brackets. The support brackets may also contribute toward preserving the structural integrity of the assembled modules, for example, by keeping the parallel rows of tubes in an equidistant configuration.

Figures 5A, 5B:
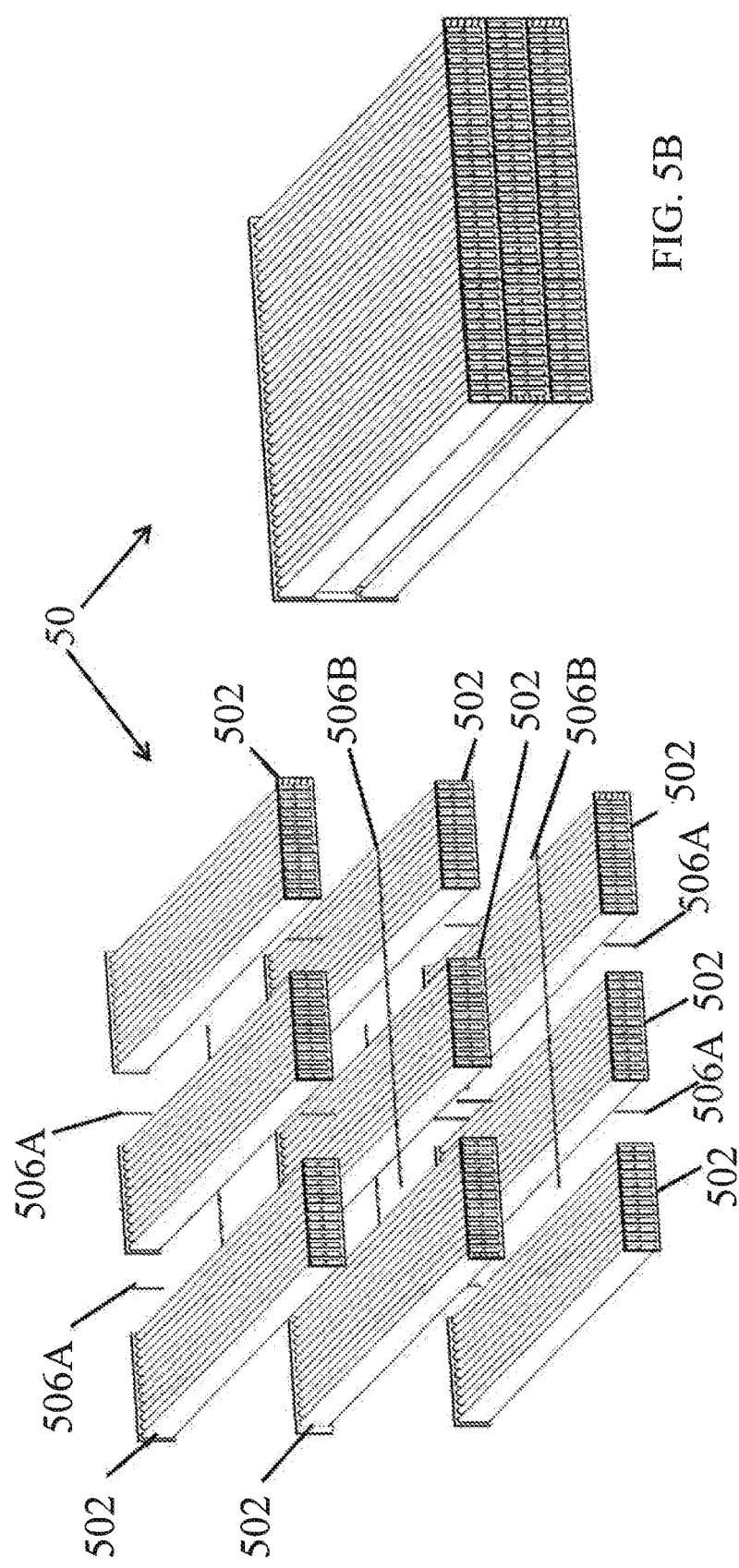
FIGS. 5A and 5B are exploded perspective views of nine exemplary modules arranged in a horizontal and vertical arrangement (FIG. 5A) and as assembled (FIG. 5B), respectively, to form a 3×3 configuration.

Referring to FIGS. 5A and 5B, one or more modules may be combined into both a horizontal and vertical configuration, generally indicated at 50. FIG. 5A illustrates an exploded view of the modules. FIG. 5B illustrates an assembled view of the modules. Individual modules may be assembled into multiple rows and columns, such as the nine modules in FIGS. 5A and 5B that are assembled into a 3×3 configuration. Other examples of assemblies may include columns and rows of one to 20 modules, for example, a 5×4 configuration. The number of modules used in an assembly may be dependent upon the required cooling capacity, and thus there may be limitless numbers of variations of both sizes of modules and sizes of assembled modules. As illustrated, the assembled structure may include both vertical splines 506A and horizontal splines 506B. The horizontal splines 506B may have a length that expands across a portion of one or more modules.

Figure 6:
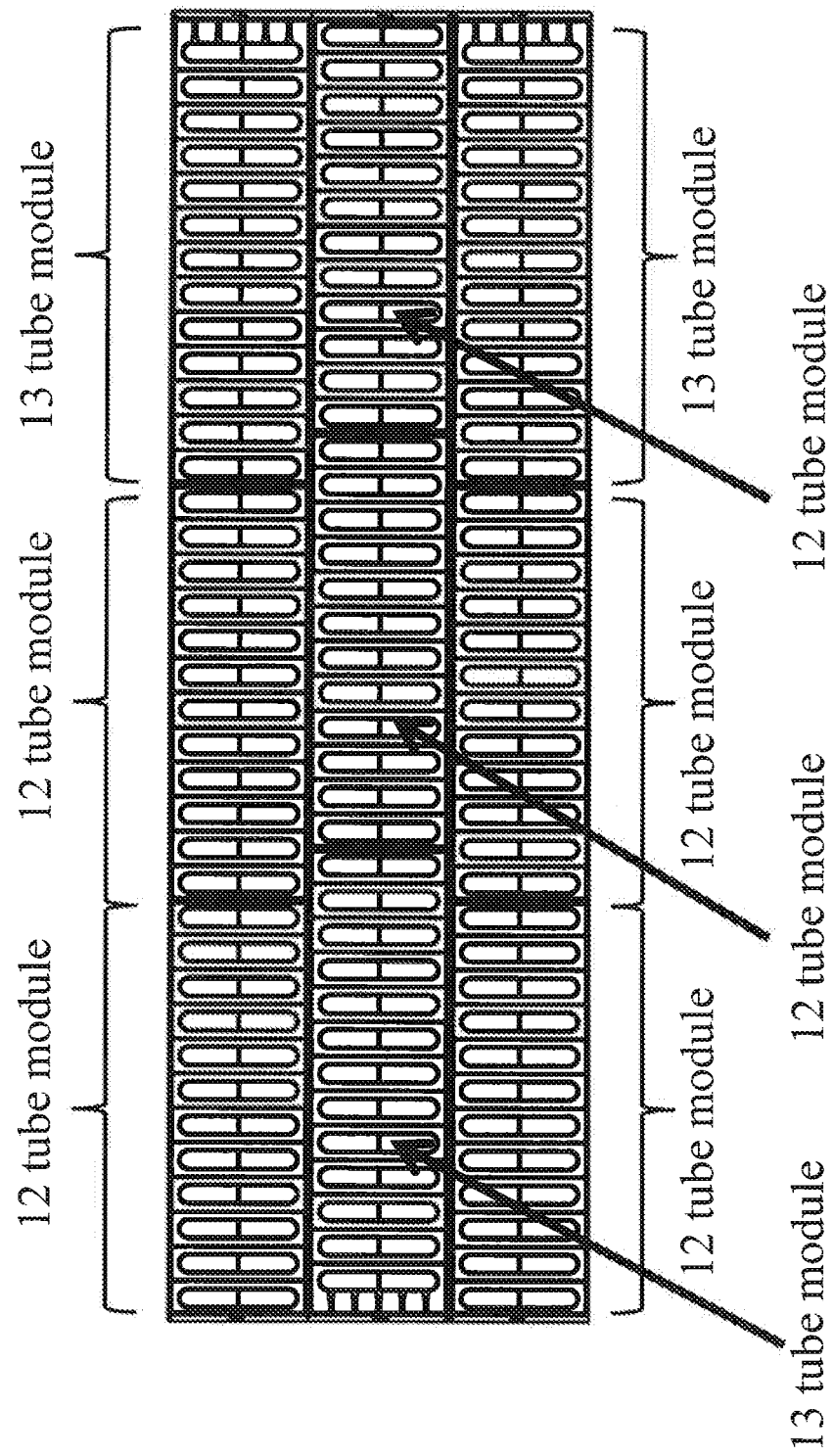
FIG. 6 is a front elevational view of the configuration shown in FIG. 5B.

In accordance with one or more embodiments, the modules may be arranged in a staggered configuration, meaning that modules having different numbers of tubes may be staggered horizontally and/or vertically. As used herein, the term "staggered" means that when multiple modules are positioned vertically, the center axes do not align vertically, and when multiple modules are arranged horizontally, the distance from the center axis to the edge of the module are not equidistant with each successive module. To further illustrate, a staggered configuration is illustrated in FIGS. 5 and 6. A front elevational view of the 3×3 format of FIG. 5 is shown in FIG. 6. For example, the first (bottom) row may have a first module with 12 tubes, a second module with 13 tubes, and a third module with 12 tubes. The second row may have a first module with 13 tubes, a second module with 12 tubes, and a third module with 12 tubes. The third row may be configured the same way as the first row (as illustrated), or may have an entirely different configuration than either the first or second rows. Staggering the modules in this manner may function to provide structural support to the entire assembled structure.

Figure 7:
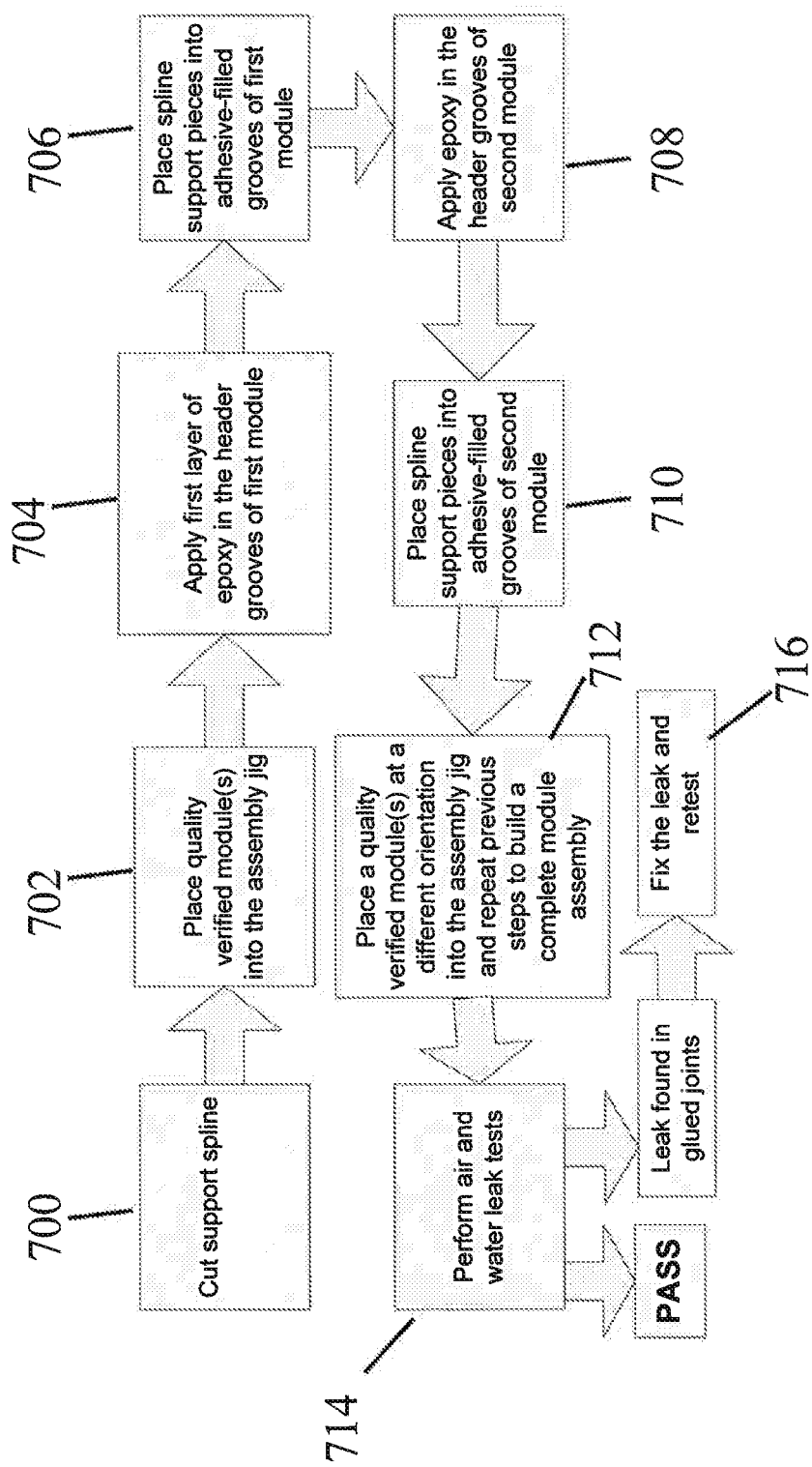
FIG. 7 is a flow chart showing an exemplary method for arranging one or more modules into a larger assembly.

An exemplary method for arranging one or more modules into a larger assembly is outlined in the flow chart of FIG. 7. As illustrated, the process may begin with step 700, where splines are cut to a desired length. In one or more embodiments, a jig may be used to assist in arranging the one or more modules into a larger assembly. However, in some embodiments, the modules may be assembled without using a jig. The jig may be used to hold modules in place and to ensure proper dimensional placement during the assembly process. For example, in step 702, one or more modules may be positioned into the assembly jig. In step 704, a layer of adhesive, such as epoxy, may be applied to one or more grooves in the headers of a first module. This may be followed by placement of the splines into the grooves, as shown in step 706. In step 708, a layer of adhesive may be applied to grooves in the header of a second module. This may be followed by the step of 710 of placing a spline into the grooves of the second module. Further, an adhesive-filled groove in the header of the second module may be aligned and mated with a spline positioned in the groove of the header in the first module (not indicated in flow chart). In step 712, one or modules having a different orientation than those of step 702 may be positioned into the assembly jig and one or more of steps 704-710 may then be repeated. For example, to create the assembly shown in FIG. 6, one row of an assembly may be completed using a 12-12-13 tube module configuration, and a second row may be completed by using the same 12-12-13 tube module configuration, but flipped by 180° so as to create a second row in the assembly with a 13-12-12 tube configuration. Once the desired number of modules has been arranged into a larger assembly, air and water leak testing of the entire structure may be performed, as shown in step 714. If the assembly passes the air and water leak test, it may move forward for additional processing (as discussed further below). If the assembly fails the air and water leak test, then repairs may be made, as illustrated by step 716. In some embodiments, if the leak can be attributed to a specific module, that module may be removed from the larger assembly and either repaired or replaced.

Figure 8:
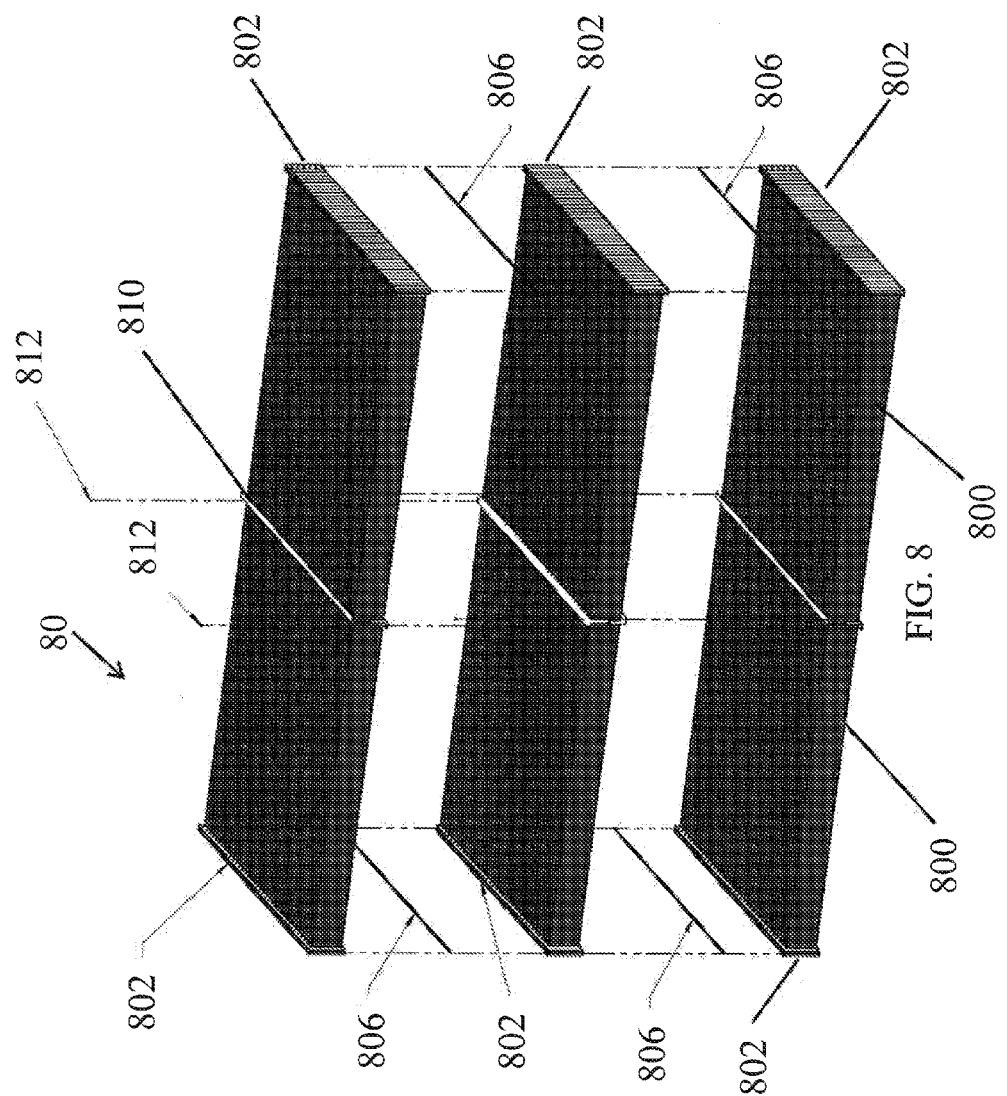
FIG. 8 is an exploded perspective view of a 3×3 module assembly.

Referring to FIGS. 8-10, one or more modules may be combined with one another along a top and/or bottom horizontal face. For example, in FIG. 8, an exploded view of each row of the 3×1 assembly includes three modules arranged in a vertical formation. As shown, each end of the tubes 800 included in each respective module may be connected to a header 802, with a linear flow path along the interior and exterior of the tubes 800. The assembly may further include one or more support brackets 810 and fasteners 812 that may be used to hold the parallel tubes in alignment with each other and provide vertical and lateral support. For example, a top and bottom bracket 810 may be attached at one or more locations along the length of the tubes 800 and to a vertical sidewall to provide vertical load transfer. The brackets 810 of one row of tubes may be attached to the brackets associated with another row of tubes using one or more fasteners 812. Although FIG. 8 illustrates one set of brackets positioned along the length of the tubes 800, as discussed previously, multiple sets of brackets 810 and fasteners 812 may be used. This type of configuration may allow for the length of the tubes to be extended, without compromising the beneficial aspects of the modular construction.

Figure 10A:
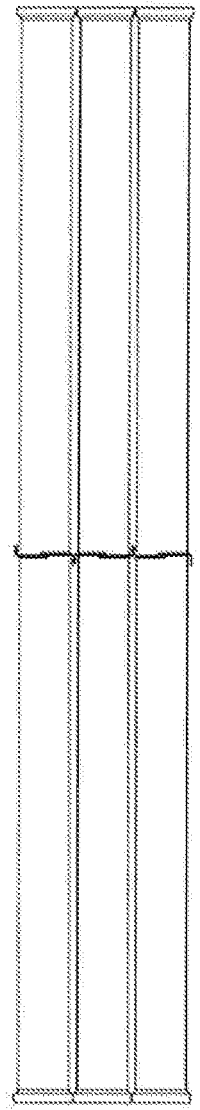
FIGS. 10A and 10B are side elevational and top plan views of the configuration shown in FIGS. 8 and 9.
Figure 10B:
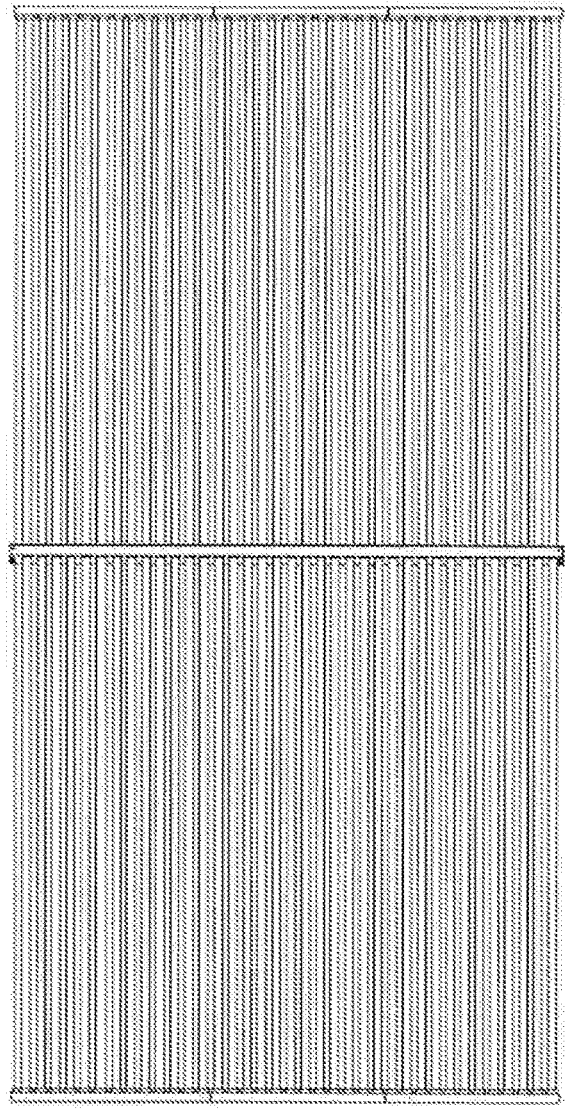

Turning to FIG. 9, a perspective view of the vertically assembled modules featured in FIG. 8 is shown. Also included is a detailed view of a top portion of the connecting portion of two horizontally adjacent headers. As shown, the vertical spline positioned between the two headers is configured in the adjacent side grooves such that a top of the spline is flush or even with the bottom of the adjoining recessed region of the adjacent grooves. This may allow placement of a horizontal spline in the top grooves of one or more horizontally positioned headers, such that the horizontal spline lies flush or even with the bottom of the adjacent groove along its entire horizontal length. Turning to FIGS. 10A and 10B, FIG. 10A illustrates a side elevational view of the configuration shown in FIGS. 8 and 9, and FIG. 10B illustrates the top plan view.

Figure 11:
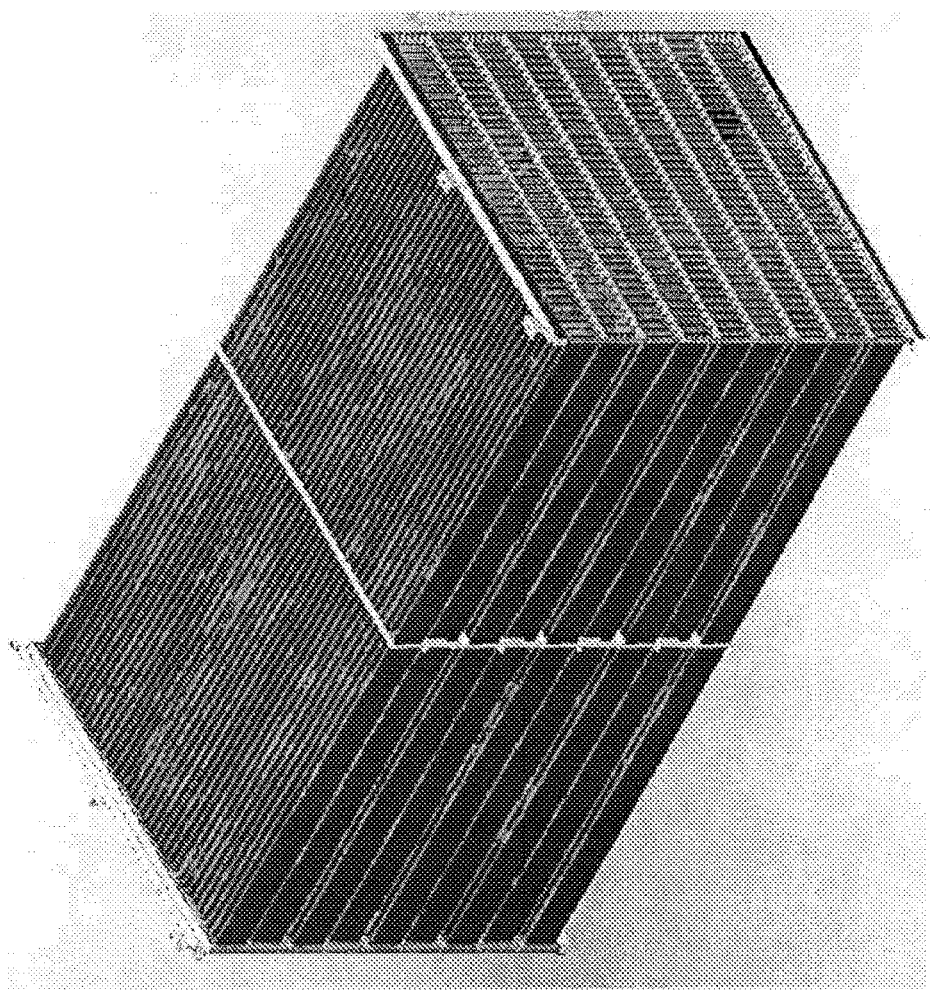
FIG. 11 is a perspective view of a 9×3 module assembly.
Figure 12:
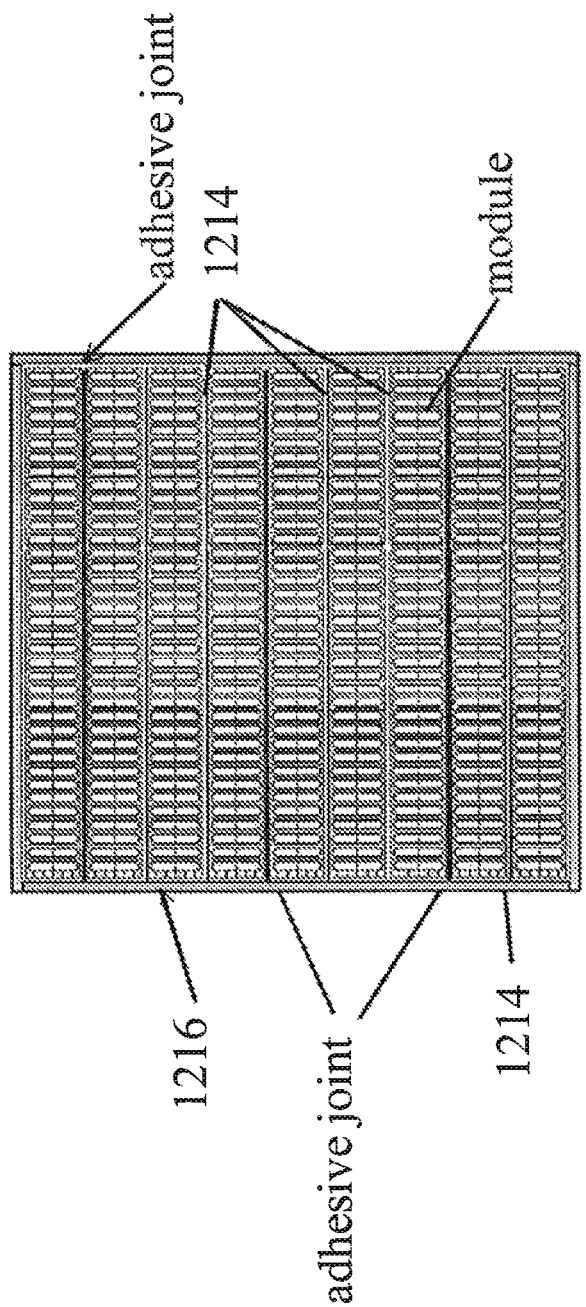
FIG. 12 is a front elevational view of the configuration shown in FIG. 11.

In FIGS. 11 and 12, a 9×3 module assembly is illustrated. A perspective view of the assembly is illustrated in FIG. 11, with the tubes and headers arranged in a similar manner as discussed above with respect to FIGS. 8-10. FIG. 12 shows a front elevational view of the arrangement of FIG. 11. As illustrated, the process for arranging the modules into a larger assembly may include the use of gaskets 1214. One or more gaskets 1214 may be positioned in between adjacent modules, such as in the horizontal and vertical regions between the rows and columns of adjacent modules, as well as the external horizontal and vertical exterior regions of the assembled modules. In some embodiments, an adhesive may be used to attach the gasket to one or more surfaces. The gaskets 1214 may be constructed from a compressible material, such as a rubber material, and may be dimensioned to cover all or a portion of any one of these regions. For example, the gasket may be constructed from a urethane or foam material, such as a silicone foam material. In other examples, the gasket may be constructed from an adhesive foam material. The thickness of the gasket may be dependent upon the operating conditions or requirements for the cooling unit, as well as the desired construction of the cooling unit. For example, the thickness of the gasket may be in a range of from about 3 mm to about 5 mm. As discussed further below, once the cooling unit is finally assembled, the gasket may be compressed to a thickness of 1 mm. In various embodiments, the gasket may be compressed during final assembly by about 10-90%. In one or more embodiments, the gasket may be undersized so as to expand and fill a designated surface area during final assembly. In the alternative, the gasket may be sized to expand beyond a certain surface area during final assembly. According to certain embodiments, one or more layers of lubricant may also be applied to an external surface of the gasket. As discussed further below, the lubricant may be used to reduce friction during the clamping process. The lubricant may be a grease or any other manmade or natural material that is capable of functioning as a friction reducer under the operating environments experienced by the cooling unit, and is compatible with the materials used for constructing the cooling unit.

One or more layers of adhesive may be applied in between and onto external regions of the modules. For example, in FIG. 12, adhesive may be used instead of a gasket in between the rows of assembled modules. In some embodiments, adhesive may be used in addition to a gasket. The adhesive may be any of the adhesives discussed previously and may be applied to cover all or a portion of the surfaces that are to be adhered to each other. In certain embodiments, several modules may be glued together using adhesive to form a larger assembly. A first assembly may be combined with a second assembly by using a gasket positioned in between the first and second assemblies. For example, FIG. 12 exemplifies a bottom first row of modules arranged in a 1×3 configuration that is further attached to a second row of modules arranged in a 1×3 configuration using a gasket 1214. A layer of adhesive may be applied to the top horizontal region of the second row of modules before arranging a third row of modules arranged in a 1×3 configuration. The positioning of a layer of adhesive or a gasket in between the rows of modules may be staggered. For example, the assembly shown in FIG. 12 features gaskets placed in between the first and second, third through fifth, and sixth through eighth rows of modules. Adhesive is placed in between the second and third, fifth and sixth, and eighth and ninth rows. Staggering the position of the gasket and adhesive in this manner may contribute to adding structural support to the larger assembly.

Referring again to FIG. 12, the assembly may further include one or more support brackets, rails (not shown) or metal holders 1216 that function to assist in holding the assembled modules into place or attach the modules into a cooling unit. Adhesive and/or gaskets and/or fasteners may be used to attach individual module assemblies to each other and to the support brackets or metal holders 1216. One or more clamping assemblies (not shown) may also be attached to the tops and/or sides of the assembled modules, as discussed further below.

Figure 13:
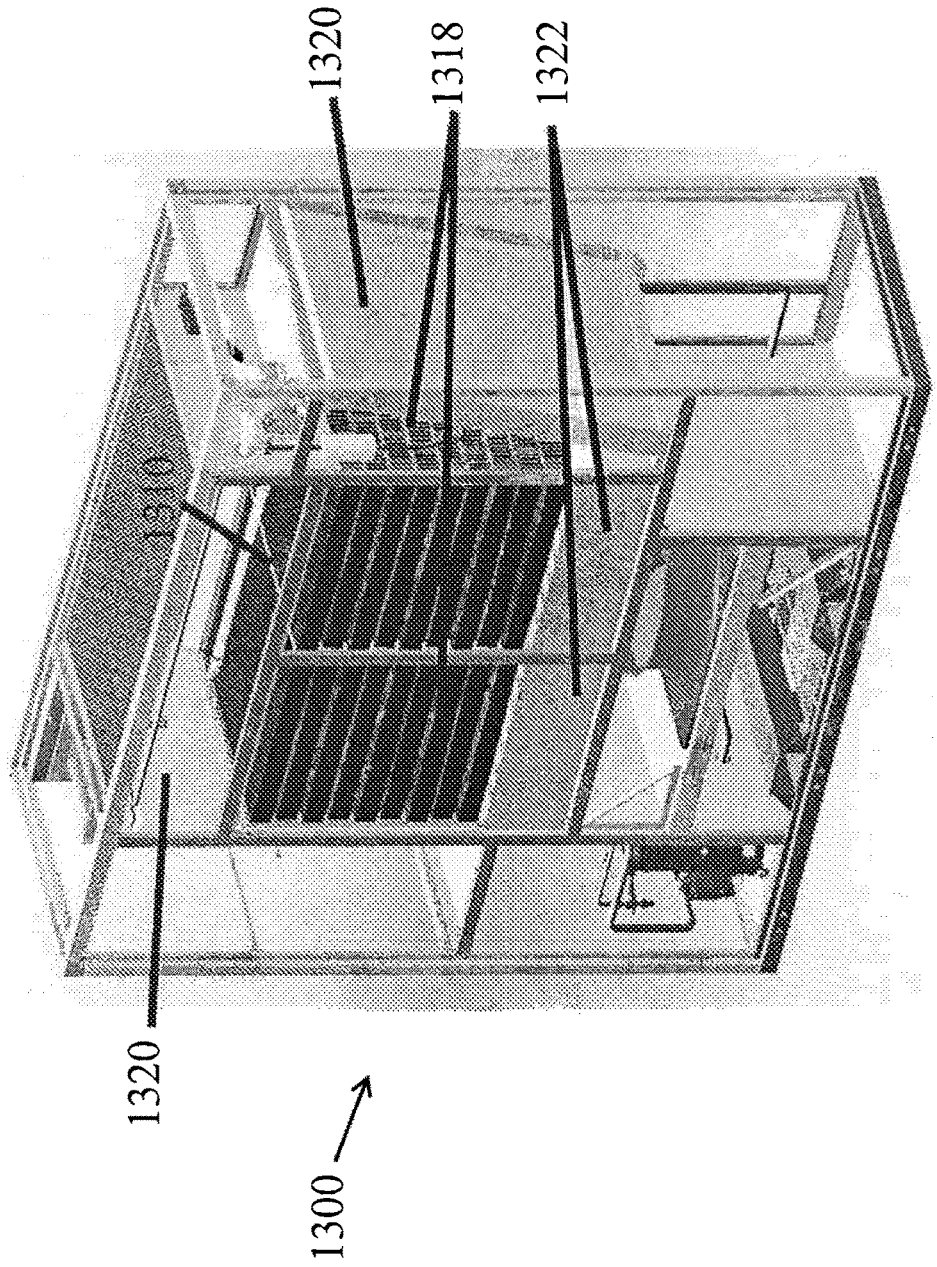
FIG. 13 is a perspective view of a fully assembled IEC cooling unit that incorporates modules constructed from methods in accordance with aspects of the invention.

In accordance with certain embodiments, one or more individual modules may be combined together and used as a cooling core in a cooling unit. The size of the unit may depend on many factors, including user requirements and other constraints. An example of a fully assembled cooling unit, generally indicated at 1300, is illustrated in FIG. 13, with the front air block panel removed for purposes of clarity. The cooling unit 1300 includes a cooling core 1318 constructed from a 9×3 module assembly, such as the one featured in FIGS. 11 and 12. The assembled modules may be inserted and used in the cooling unit without the use of an external frame that surrounds the modules. The elimination of the frame may provide several advantages, including lower material and installation costs. As shown, one or more brackets 1310 may be distributed along the length of the tubes. The brackets 1310 may be attached to the air blocking panel sidewalls (not shown) using one or more fasteners. One or more air blocking panels 1320 may be positioned vertically on one or more sides of the cooling core 1318. The cooling unit 1300 may further include piping, nozzles, manifolds, valves, and connectors that may be used to provide flow paths for air and cooling liquid throughout the unit. For example, the internal surfaces of the tubes may be in communication with one or more sources of air, and the external surfaces of the tubes may be in communication with a source of cooling fluid, such as water, and/or a source of air. One or more water trays 1322 may be positioned under the modules for purposes of collecting cooling water. The water trays 1322 may be configured to collect water from a particular module or grouping of modules.

Figure 14:
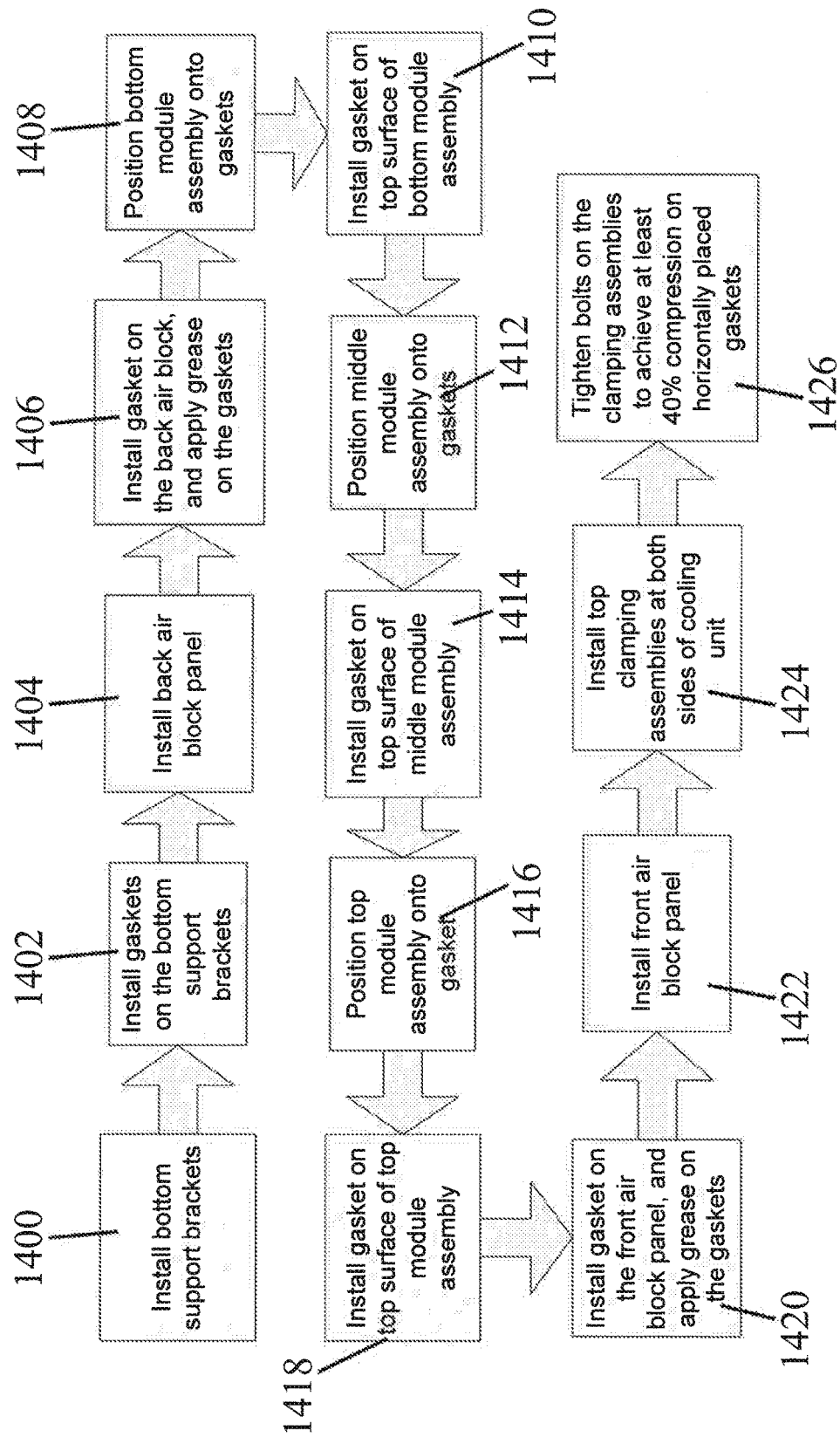
FIG. 14 is a flow chart showing an exemplary method for installing one or more modules into a cooling unit.

One example of a process for assembling a cooling unit, such as an IEC unit, using one or more of the disclosed modules as a cooling core is illustrated in the flowchart of FIG. 14. According to certain embodiments, this particular method may be used where one or more individual modules are arranged into one or more larger assemblies in a first location, as discussed above, and then brought to a second location where other elements of the unit may already be installed, such as framework, ducting, fans, and piping. The process may begin at step 1400 by installing one or more lower support brackets or rails to support the modules.

Gaskets may be placed onto the brackets, as indicated in step 1402. Next, in step 1404, a vertical air block, such as a blocking panel, may be installed on one or more sides of the IEC unit, such as in the rear. In step 1406, one or more vertical gaskets may be installed on the rear air blocking panel. A layer of lubricant, such as grease, may also be applied to the exterior surface of the gasket. A first assembly of modules may be positioned in step 1408 onto the gaskets to form the bottom row or rows of the cooling core. Next, in step 1410, a gasket may be positioned onto the horizontal surface of the first assembly of modules. This is followed by step 1412, where a second assembly of modules is positioned vertically on top of the gasket and modules of the first assembly. Steps 1410 and 1412 are repeated in steps 1414 and 1416 using a third assembly of modules and an additional gasket positioned onto the horizontal surface of the second assembly. This is followed by step 1418, where another gasket may be positioned onto the top horizontal surface of the third assembly of modules. In step 1420, a gasket may be attached to another vertical air block, such as a front blocking panel, and a layer of lubricant may be applied to its exterior surface. The front blocking panel is then installed in step 1422. Next, in step 1424, one or more clamping assemblies may be attached to the tops and/or sides of the assembled modules. For example, the clamping assemblies may be attached to a top and bottom rail that serves to support the modules. In some embodiments, the clamping assemblies may be attached to the support brackets associated with the tube assembly. In step 1426 the clamps are then tightened, for example, using one or more bolts on the clamping assembly. The clamps may be tightened so that the support brackets are pressed into the bottom and top support rail, which effectively compresses the one or more gaskets distributed throughout the cooling unit. Tightening may be performed until a desired compression in the gaskets is achieved. For example, in some embodiments, the clamps may be tightened until at least a 40% compression is achieved by the horizontally placed gaskets, such as the gaskets positioned in steps 1402, 1410, 1414, and 1418.

According to another aspect, the modular cooling core may be used for retrofitting an already existing cooling unit. For example, an IEC cooling unit may include a one-piece polymer core. This cooling core may be removed and replaced using one or more modules as characterized and discussed above.

The modular approach included in this disclosure allows for several advantages, including the ability to remove and repair or replace individual modules that may malfunction during use. For example, instead of having to remove the entire cooling core, a single malfunctioning module or assembly of modules may be removed and then repaired or replaced. For example, one or more module assemblies separated by gaskets may be removed and replaced. This approach offers significantly lower repair costs in terms of labor and materials, since the entire cooling core does not need to be removed and replaced. This is especially significant in operating environments with small footprints, where servicing the cooling unit may be cumbersome due to space constraints.

Other advantages of the disclosure may include lower assembly costs related to labor and materials, since the modular construction requires smaller and lighter components when compared to single-block polymer cooling cores that are currently available on the market. The modular construction may also be much easier to install in areas with small footprints, since smaller components may be brought in separately and sequentially assembled.

As recognized by one of skill in the art, one or more steps of the flow charts shown in FIGS. 2, 7, and 14 may be eliminated or modified, and the steps may be performed out of order, or other steps may be included that are not explicitly identified. For example, additional modules may be added to an assembly, or adhesive may be used in place of a gasket.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A method for constructing a module of a modular cooling unit, the method comprising:
   acquiring a plurality of tubes, each tube having a first end and a second end, an interior surface, an exterior surface, and a support member operatively connected to the interior surface; and
   overmolding a first header onto at least a portion of the first ends of the plurality of tubes, the first header configured to have a plurality of parallel first slots, each slot of the parallel first slots configured to have an extended surface configured to receive and retain the first end of the tube, wherein overmolding allows the extended surfaces of the plurality of parallel first slots to form over the first ends of the plurality of tubes to create a watertight connection between the first header and the first ends of the plurality of tubes.

2. The method of claim 1, further comprising
   overmolding a second header onto at least a portion of the second ends of the plurality of tubes, the second header configured to have a plurality of parallel second slots, each slot of the parallel second slots configured to have an extended surface configured to receive and retain the second end of the tube, wherein overmolding allows the extended surfaces of the plurality of parallel second slots to form over the second ends of the plurality of tubes to create a watertight connection between the second header and the second ends of the plurality of tubes.

3. The method of claim 1, further comprising performing an air and leak test on the module.

4. The method of claim 1, wherein the first header further includes a top groove, a bottom groove, a first side groove, and a second side groove, the method further comprising applying an adhesive in at least one of the top, bottom, first side, and second side grooves.

5. The method of claim 4, further comprising:
   acquiring at least one spline; and
   positioning a spline into at least one of the top, bottom, first side, and second side grooves containing the applied adhesive, wherein the at least one spline is dimensioned to be received and retained by and extend across at least a portion of the top, bottom, first side, and second side grooves.

6. The method of claim 5, further comprising assembling one or more modules into a modular cooling unit.

7. The method of claim 6, wherein assembling one or more modules comprises arranging at least two modules to be adjacent one another in a horizontal configuration, the at least two modules being arranged such that a spline is positioned in the first side and the second side grooves between the at least two modules and a spline is positioned in the top grooves of the at least two horizontally adjacent modules.

8. The method of claim 7, further comprising positioning a spline in the bottom grooves of the at least two horizontally adjacent modules.

9. The method of claim 6, wherein assembling one or more modules comprises arranging at least two modules to be adjacent one another in a vertical configuration, the at least two modules being arranged such that a spline is positioned in the top and bottom grooves between the at least two vertically adjacent modules.

10. The method of claim 6, wherein assembling one or more modules comprises:
acquiring at least one gasket; and
positioning a gasket onto at least one of a top and a bottom of the one or more modules such that the gasket extends horizontally across at least a portion of the top and the bottom of the one or more modules.

11. The method of claim 6, wherein assembling one or more modules comprises applying adhesive onto at least one of a top, a bottom, a first side, and a second side of the one or more modules.

12. A module of a modular cooling unit, the module comprising:
a plurality of tubes, each tube having a first end and a second end, and an interior surface and an exterior surface;
a support member operatively connected to the interior surface of each of the plurality of tubes; and
a first header positioned at the first ends of the plurality of tubes to form a watertight connection between the first header and the first ends of the plurality of tubes, the first header having a top groove, a bottom groove, a first side groove, and a second side groove, and a plurality of parallel first slots, wherein each slot of the parallel first slots has an extended surface configured to receive and retain the first end of the tube.

13. The module of claim 12, further comprising a second header positioned at the second ends of the plurality of tubes to form a watertight connection between the second header and the second ends of the plurality of tubes, the second header having a top groove, a bottom groove, a first side, and a second side groove, and a plurality of parallel second slots, wherein each of the parallel second slots has an extended surface configured to receive and retain the second end of the tube.

14. The module of claim 12, further comprising at least one spline, wherein the at least one spline is dimensioned to be received and retained by and extend across at least a portion of the top, bottom, first side, and second side grooves.

15. The module of claim 14, further comprising at least two modules configured to be adjacent in a horizontal configuration, the at least two modules configured such that a spline is positioned in the first side and the second side grooves between the at least two horizontally adjacent modules and a spline is positioned in the top grooves of the at least two horizontally adjacent modules.

16. The module of claim 15, further comprising a spline positioned in the bottom grooves of the at least two horizontally adjacent modules.

17. The module of claim 15, wherein at least one module has a different number of plurality of hollow tubes than another module, such that one or more horizontally arranged modules have a staggered configuration.

18. The modular cooling unit of claim 14, further comprising at least two modules configured to be adjacent in a vertical configuration, the at least two modules configured such that a spline is positioned in the top and bottom grooves between the at least two vertically adjacent modules.

19. The module of claim 18, wherein at least one module has a different number of plurality of hollow tubes than another module, such that one or more vertically arranged modules have a staggered configuration.

20. A method of retrofitting a cooling unit, comprising:
replacing at least one component of the cooling unit with one or more modules, wherein the module includes
a plurality of tubes, each tube having a first end and a second end, and an interior surface and an exterior surface;
a support member operatively connected to the interior surface of each of the plurality of tubes; and
a first header positioned at the first ends of the plurality of tubes to form a watertight connection between the first header and the first ends of the plurality of tubes, the first header having a top groove, a bottom groove, a first side groove, and a second side groove, and a plurality of parallel first slots, wherein each slot of the parallel first slots has an extended surface configured to receive and retain the first end of the tube.

* * * * *